United States Patent
Yu et al.

(10) Patent No.: US 7,283,367 B2
(45) Date of Patent: Oct. 16, 2007

(54) LOCKING DEVICE FOR HEAT SINK

(75) Inventors: Fang-Xiang Yu, Shenzhen (CN);
Yih-Jong Hsieh, Tu-Cheng (CN);
Shu-Ho Lin, Tu-Cheng (TW)

(73) Assignees: Fu Zhun Precision Industry (Shenzhen) Co., Ltd., Bao'an District, Shenzhen, Guangdong Province (CN);
Foxconn Technology Co., Ltd., Tu-Cheng, Taipei Hsien (TW)

( * ) Notice: Subject to any disclaimer, the term of this patent is extended or adjusted under 35 U.S.C. 154(b) by 184 days.

(21) Appl. No.: 11/141,096

(22) Filed: May 31, 2005

(65) Prior Publication Data
US 2006/0120055 A1    Jun. 8, 2006

(30) Foreign Application Priority Data
Dec. 6, 2004    (CN)    ......... 2004 2 0102511

(51) Int. Cl.
*H05K 7/20*    (2006.01)
(52) U.S. Cl. ............ 361/719; 361/697; 361/695
(58) Field of Classification Search ........ 361/704, 361/697, 695, 710, 719; 257/718, 719; 24/295, 24/296, 457
See application file for complete search history.

(56) References Cited

U.S. PATENT DOCUMENTS 6,731,504 B1    5/2004    Liu ................. 361/704

FOREIGN PATENT DOCUMENTS

| CN | 2446571 Y | 9/2001 |
|---|---|---|
| TW | M246674 | 10/2004 |

*Primary Examiner*—Javaid H. Nasri
(74) *Attorney, Agent, or Firm*—Morris Manning Martin LLP; Tim Tingkang Xia, Esq.

(57) ABSTRACT

A locking device for mounting a heat sink (50) to a heat generating component surrounded by a retention module (60). The locking device includes a first locking member (10), a second locking member (20) and an operating member (30). The first locking member secures a first side of the heat sink with a first side of the retention module. The second locking member is disposed at a second side of the heat sink opposing to the first side. The operating member is pivotably attached to the second locking member and is capable of acting upon the heat sink to drive the second locking member moving from a released position to a locked position. The operating member has a cam (31) and a free end. At the locked position, the cam downwardly depresses the heat sink and upwardly pulls the second locking member, and the free end locks at the retention module.

17 Claims, 6 Drawing Sheets

LOCKING DEVICE FOR HEAT SINK

TECHNICAL FIELD

The present invention relates generally to a locking device, and more particularly to a locking device for securing a heat sink to a heat-generating component.

BACKGROUND

It is widely acknowledged that heat is produced during operations of electronic devices such as central processing units (CPUs). The heat produced must be rapidly removed to ensure the CPUs working normally. Typically, a heat sink is provided to a CPU for removing heat from the CPU. In order to keep the heat sink into close contact with the CPU, a locking device is generally required.

A variety of locking devices have been developed for heat sink mounting purpose, among which plate-type locking device is widely used. A plate-type locking device generally has a M-shaped configuration and includes a central V-shaped pressing portion and a pair of latching legs respectively extending from opposite ends of the pressing portion. China Patent No. 00239696.3 shows a good example of the plate-type locking device, for mounting a heat sink to a socket on which a CPU is mounted. In assembly, the latching legs of the locking device engage with a pair of protrusions formed at the socket, and the pressing portion of the locking device is received in a groove defined in the heat sink and downwardly presses the heat sink against the CPU, thereby maintaining an intimate thermal contact between the heat sink and the CPU.

The aforementioned plate-type locking device is generally made from rigid metals, and a special tool is generally needed during the mounting or dismounting of the heat sink. It is difficult and inconvenient to operate such a tool, and occasionally, the latching legs slide over the protrusions of the socket to damage adjacent electronic devices around the CPU. Moreover, the presence of the groove, which is especially defined in the heat sink for accommodating the pressing portion of the locking device, greatly reduces the total heat dissipating surface area of the heat sink, and accordingly decreases the heat dissipating efficiency of the heat sink.

In view of the above-mentioned disadvantages of the plate-type locking device, there is a need for a locking device which can easily and conveniently mount or dismount a heat sink to or from a heat generating component. What is also needed is a locking device, which does not impact the heat dissipating efficiency of the heat sink.

SUMMARY

A locking device in accordance with a preferred embodiment of the present invention is applied to mount a heat sink to a heat generating component surrounded by a retention module. The locking device includes a first locking member, a second locking member and an operating member. The first locking member is located at a first side of the heat sink and secures the heat sink with the retention module. The second locking member is disposed at a second side of the heat sink opposing the first side. The operating member includes a cam pivotably attached to the second locking member and is capable of moving between first and second positions to cause the second locking member to engage with the retention module.

Other advantages and novel features of the present invention will become more apparent from the following detailed description of preferred embodiment when taken in conjunction with the accompanying drawings, in which:

DETAILED DESCRIPTION OF PREFERRED EMBODIMENT

Figure 1:
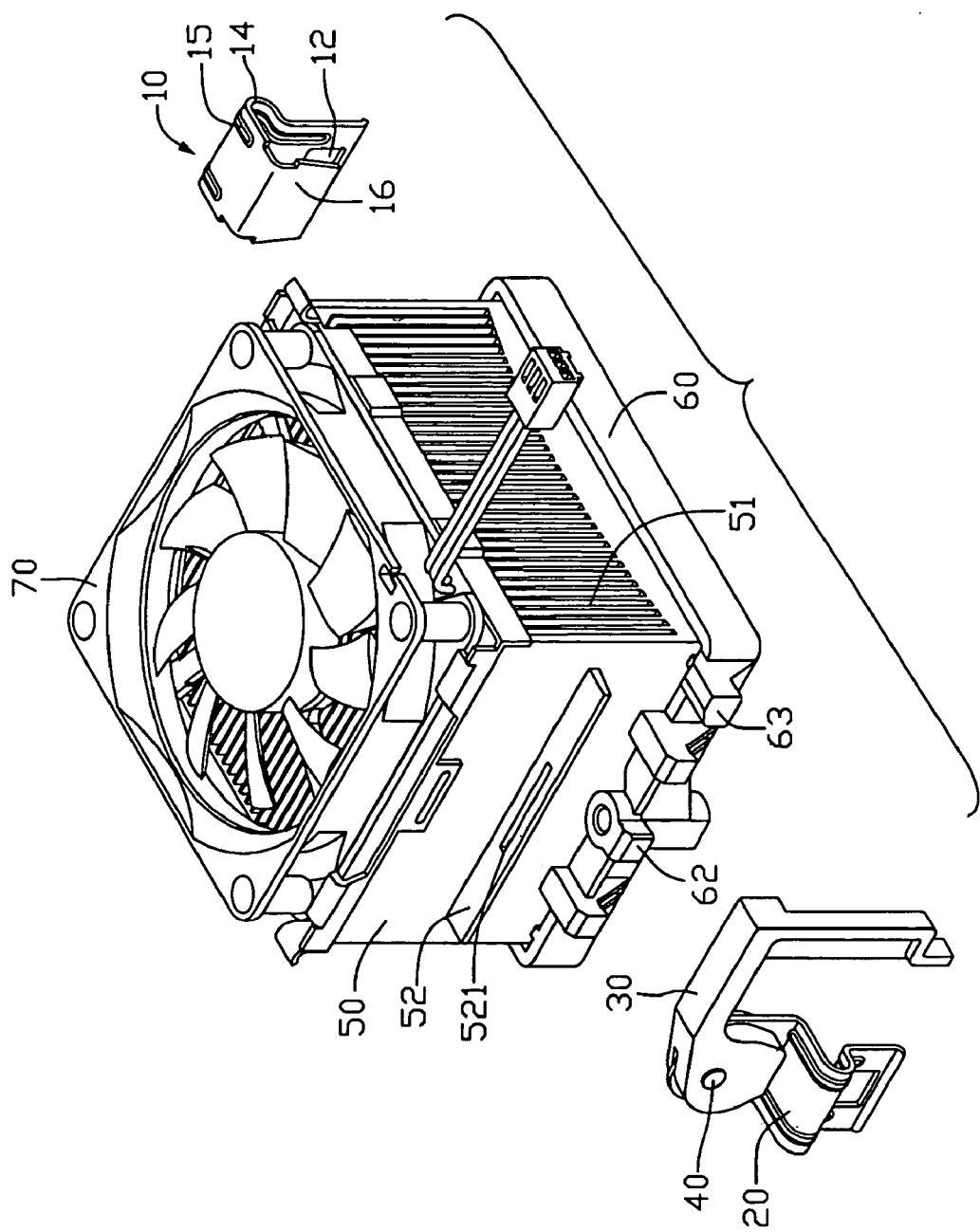
FIG. 1 is an exploded, isometric view of a locking device in accordance with a preferred embodiment of the present invention, together with related components.
Figure 2:
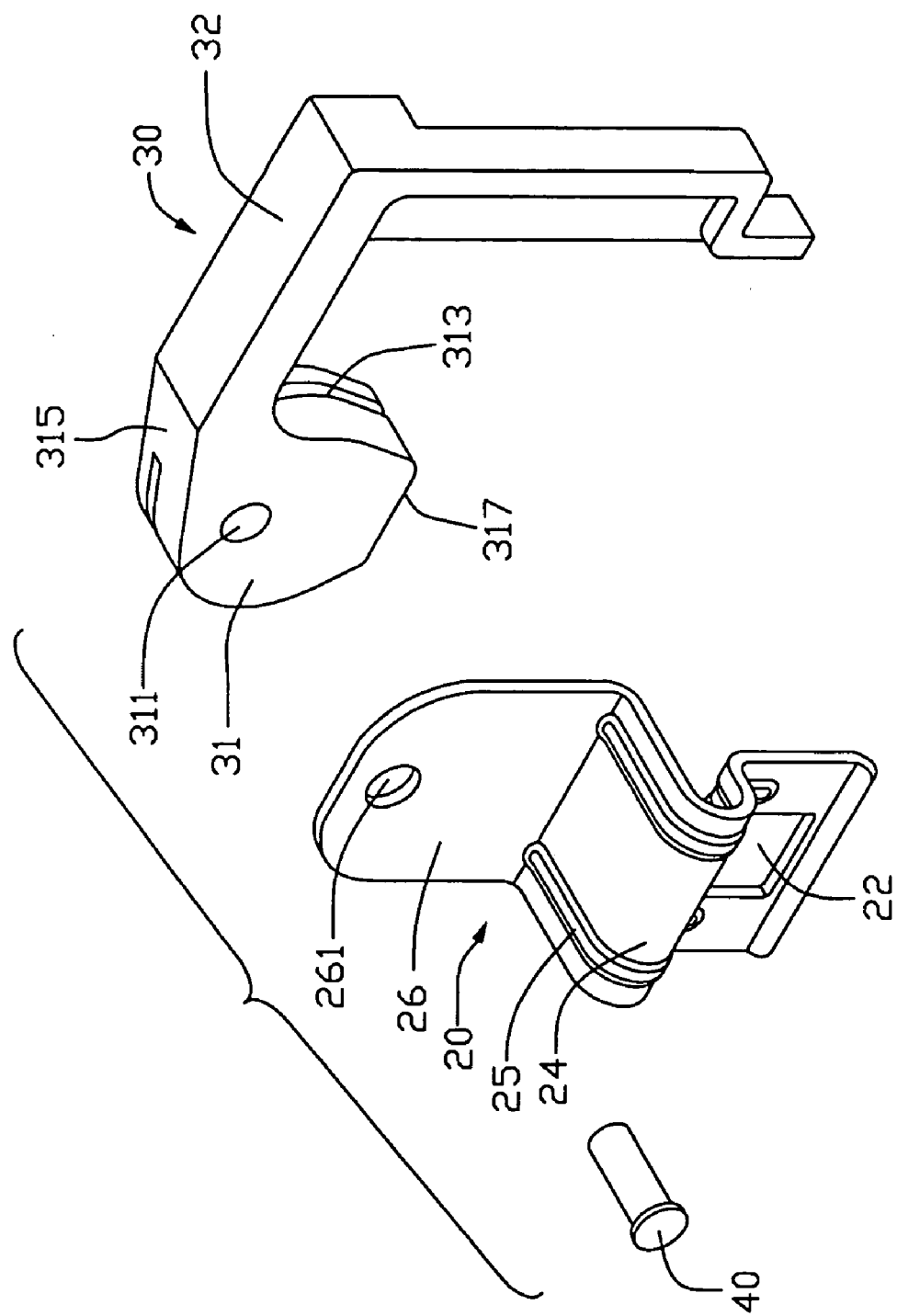
FIG. 2 is an exploded, isometric view showing parts of the locking device of FIG. 1.
Figure 3:
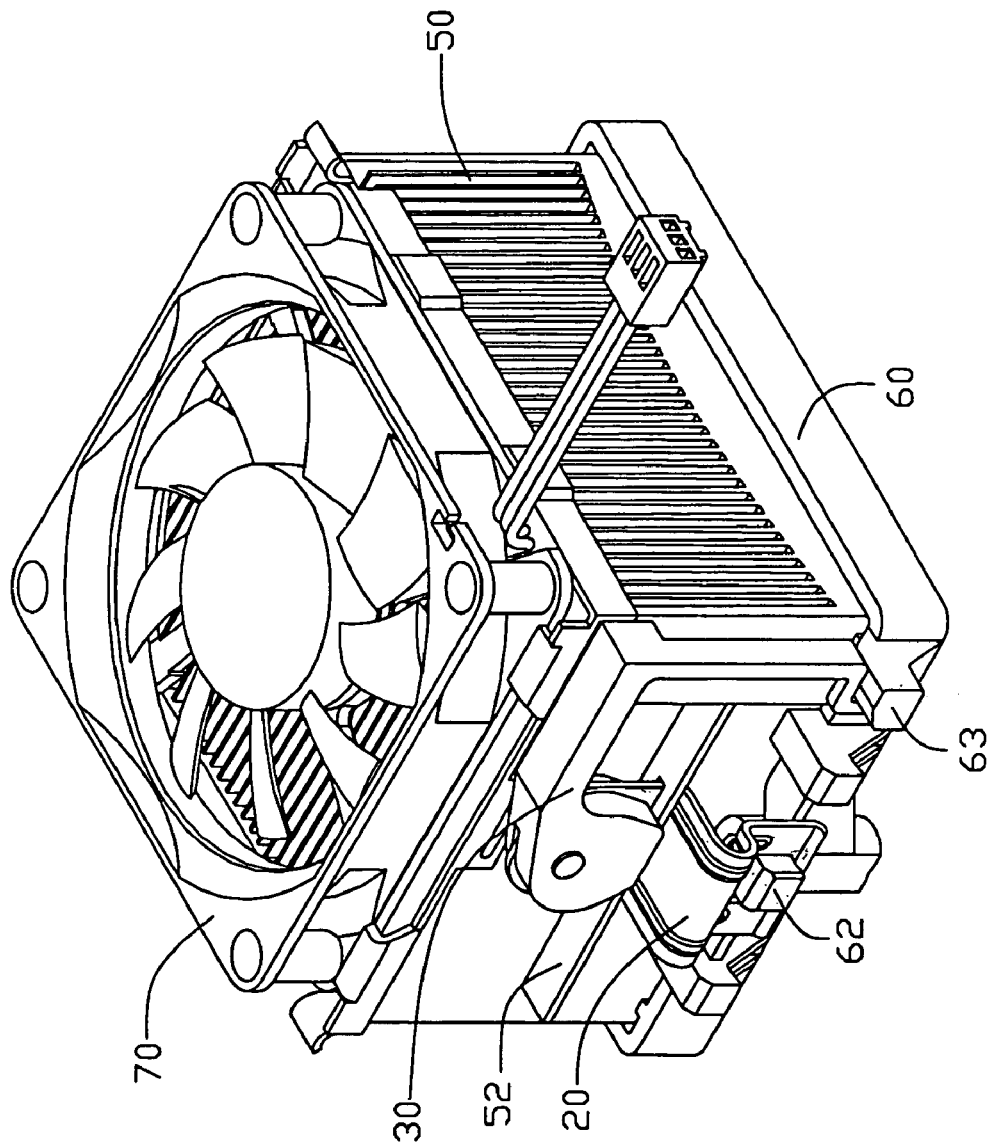
FIG. 3 is an assembled view of FIG. 1.

FIGS. 1 and 2 show a locking device according to a preferred embodiment of the present invention, for securing a heat sink 50 to a retention module 60 on which the heat sink 50 is seated. The retention module 60 is typically for being mounted to a printed circuit board (PCB) on which a CPU (both the PCB and the CPU not shown) is installed and surrounded by the retention module 60. The heat sink 50 is maintained by the locking device to thermally contact the CPU for heat removal after being secured to the retention module 60.

Figure 4:
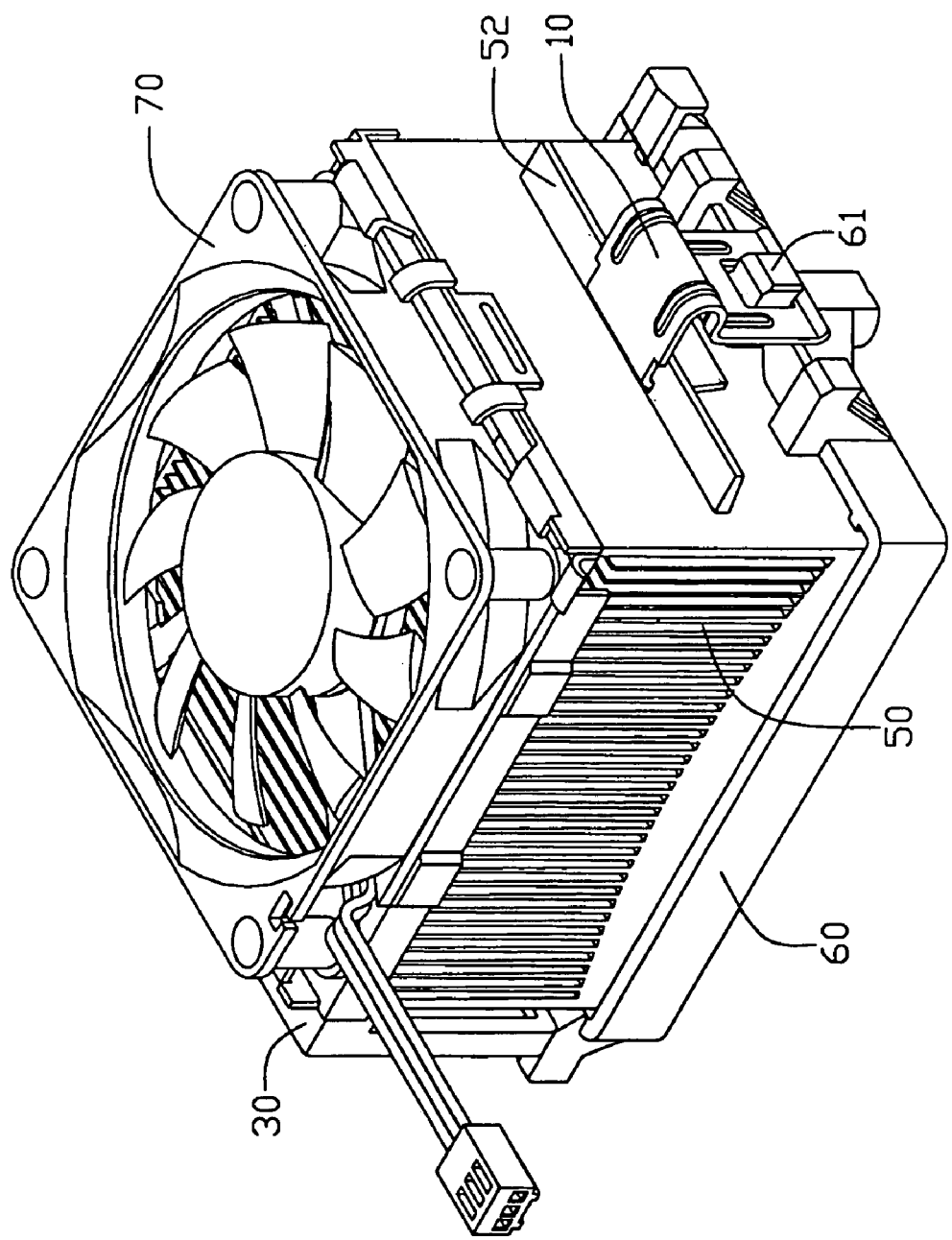
FIG. 4 is an assembled view of FIG. 1, but viewed from another aspect.
Figure 5:
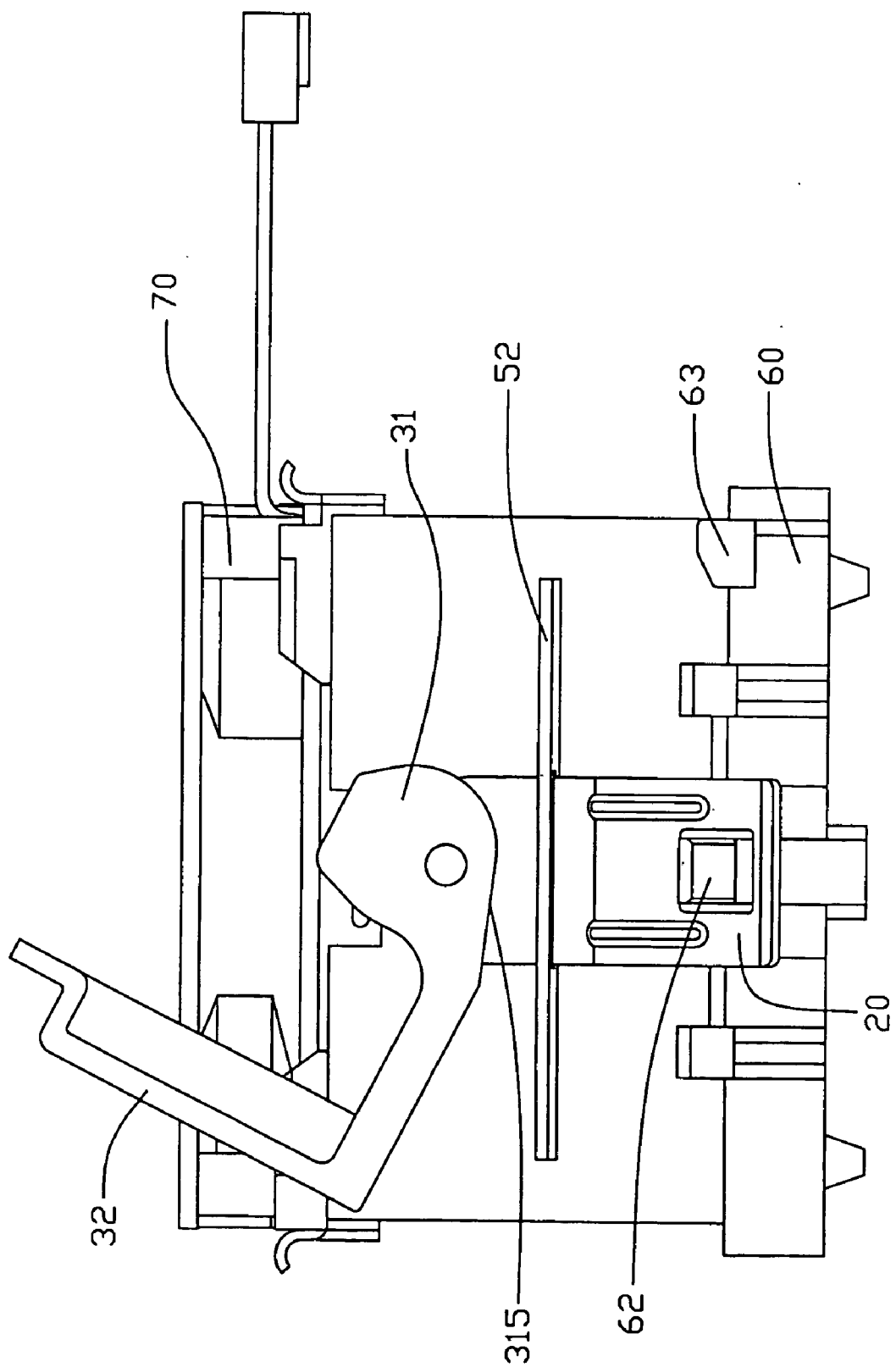
FIG. 5 is a side elevation view of FIG. 3, but with the operating member unlocked.
Figure 6:
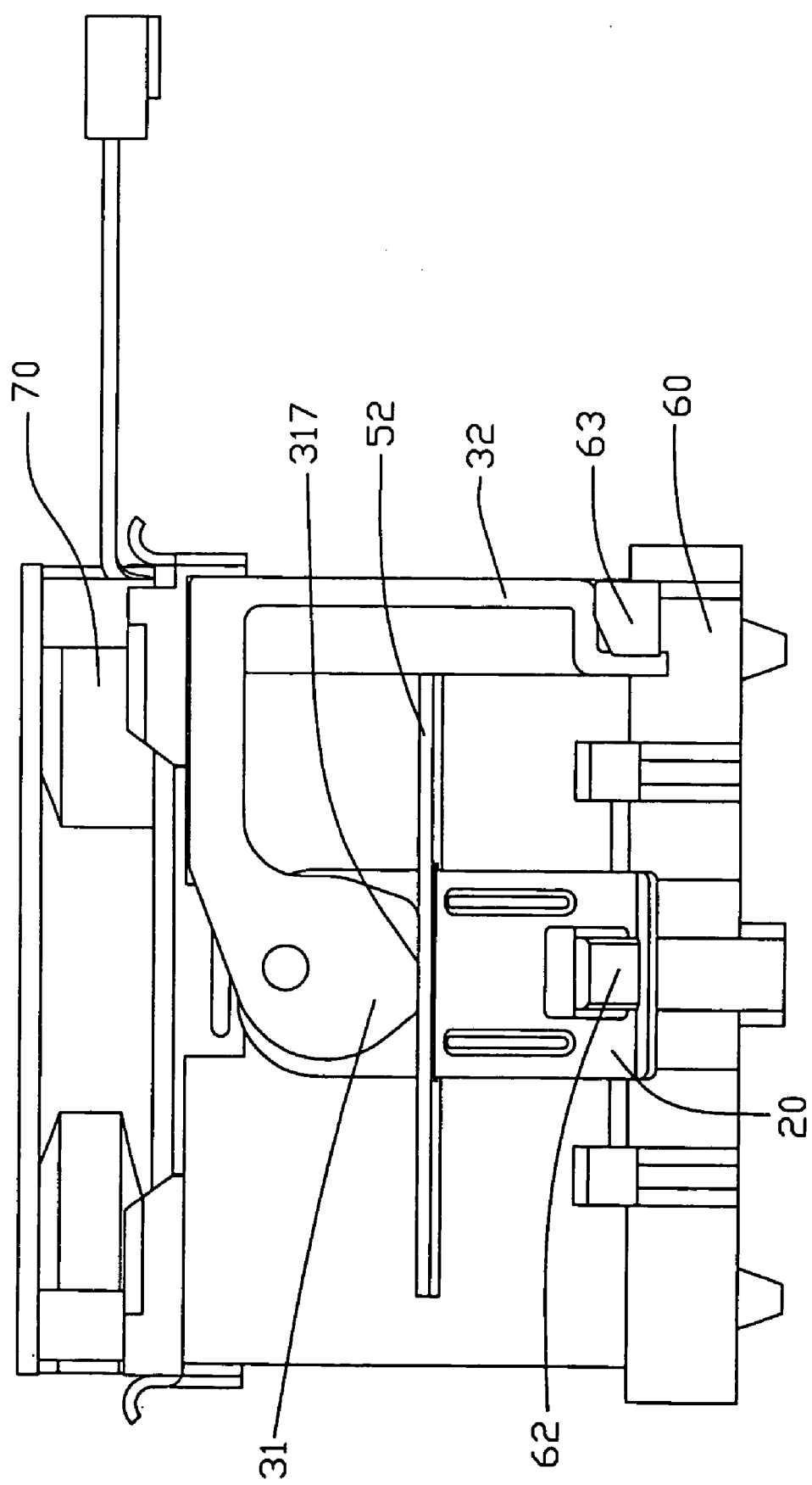
FIG. 6 is a side elevation view of FIG. 3.

The heat sink 50 includes a plurality of upward-extending cooling fins 51. Two outermost cooling fins 51 each have a flat plate 52 (see FIG. 1 and FIG. 4) extending outwardly from a substantial middle portion thereof. The flat plates 52 are oriented perpendicularly to the cooling fins 51. Each flat plate 52 defines an elongated groove 521 therein. The retention module 60 has a frame configuration and includes a plurality of protruding portions, among which the first protruding portion 61 (referring to FIG. 4) locates at one side of the retention module 60, the second and third protruding portions 62, 63 locate at an opposite side of the retention module 60. Preferably, a cooling fan 70 is attached to a top of the heat sink 50 for generating forced airflow to dissipate heat from the cooling fins 51.

The locking device includes a first locking member 10, a second locking member 20, an operating member 30 and a pivot 40. Each of the first and second locking members 10, 20 is integrally made of a metal plate, and is therefore a one-piece member. The first and second locking members 10, 20 have retaining holes 12, 22 at their respective bottom portions for locking purpose and have resilient portions 14, 24 at their respective central portions for increasing resiliency. The resilient portions 14, 24 are arc-shaped. A plurality of reinforcing ribs 15, 25 is formed at the resilient portions 14, 24 respectively for improving the mechanical performance of the corresponding locking members 10, 20. An upper portion of the first locking member 10 is bent downwardly to form a locking portion 16. The second locking member 20 has an upright mounting portion 26 extending from the resilient portion 24. The mounting portion 26 defines therein a through hole 261. The operating member 30 includes a cam 31 and an L-shaped operation handle 32 extending from the cam 31. The cam 31 defines axially a pivot hole 311 corresponding to the through hole 261 of the second locking member 20, and defines a receiving groove 313 which transversely crosses the pivot hole 311 and splits the cam 31 into two halves. The cam 31 includes a releasing portion 315 and an engaging portion 317 in its periphery, the distance between the engaging portion 317 and the pivot hole 311 being greater than that between the releasing portion 315 and the pivot hole 311.

Referring also to FIGS. 3-6, in assembly, the locking portion 16 of the first locking member 10 is inserted into the groove 521 of one of the flat plates 52 of the heat sink 50, which is located at a common side with the first protruding portion 61. The retaining hole 12 of the first locking member 10 engagingly receives the first protruding portion 61 of the retention module 60. Thus, the heat sink 50 and the retention module 60 are tied together via the first locking member 10 at the common side. The mounting portion 26 of the second locking member 20 extends through the groove 521 of the other flat plate 52, and the retaining hole 22 of the second locking member 20 loosely receives the second protruding portion 62 of the retention module 60. The operating member 30 is pivotably attached to the second locking member 20 by the receiving groove 313 of the cam 31 fittingly receiving the mounting portion 26 and the pivot 40 successively extending in the through hole 261 of the mounting portion 26 and the pivot hole 311 of the cam 31. At this stage, the second locking member 20 is located at a released position (referring to FIG. 5) with the releasing portion 315 of the cam 31 located above and facing to the corresponding flat plate 52. Then, the operating member 30 is pushed to rotate clockwise (viewed from FIG. 5) to cause the cam 31 to get into contact with the corresponding flat plate 52. As the operating member 30 continues being pushed, the second locking member 20 is accordingly driven to move upwardly with respect to the heat sink 50 and the retention module 60 as a result of the interaction between the cam 31 and the corresponding flat plate 52. As the operating member 30 is further pushed until the engaging portion 317 of the cam 31 completely abuts downwardly on the corresponding flat plate 52, the second locking member 20 is pulled upwardly by the cam 31 to rise to its uppermost position. At this stage, the second locking member 20 is located at a locked position with a lower portion (not labeled) of the second locking member 20 in which the retaining hole 22 is defined firmly engaging with the second protruding portion 62 of the retention module 60 and a free end of the operation handle 32 locking at the third protruding portion 63. As a result, the first and second locking members 10, 20 commonly exert a downward force on the heat sink 50 against the CPU to maintain an intimate contact therebetween.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A locking device for a heat sink comprising:
   a first locking member having a locking portion formed at an upper portion thereof for locking with said heat sink so as to cause the first locking member to attach to a first side of said heat sink;
   a second locking member for being disposed at a second side of said heat sink opposing said first side, the second locking member being spaced and disconnected from the first locking member; and
   an operating member comprising a cam pivotably attached to the second locking member for driving the second locking member to move with respect to said heat sink;
   wherein each of the first and second locking members is made from a metal plate, and the first and second locking members each have a resilient portion formed at a central portion thereof for increasing resiliency thereof.

2. The locking device of claim 1, wherein the second locking member has a mounting portion formed at an upper portion thereof and the cam defines a receiving groove fittingly receiving the mounting portion.

3. The locking device of claim 1, wherein the first and second locking members each define a retaining hole at a bottom portion thereof.

4. An assembly comprising:
   a heat sink;
   a retention module disposed about the heat sink;
   a first locking member located at a first side of the heat sink, the first locking member having an upper portion locked with the heat sink and a bottom portion securely engaged with the retention module;
   a second locking member disposed at a second side of the heat sink opposing said first side, the second locking member having an upper portion and a bottom portion engagable with the retention module; and
   an operating member attached to the upper portion of the second locking member and being capable of acting upon the heat sink to cause the second locking member to engage with the retention module from a released position to a locked position;
   wherein a first flat plate and a second flat plate are respectively provided at said first and second sides of the heat sink, and the upper portion of the first locking member engages with the first flat plate and the upper portion of the second locking member extends through the second flat plate.

5. The assembly of claim 4, wherein the operating member comprises a cam located above the second flat plate and pivotably engaged with the second locking member, wherein the cam defines a receiving groove fittingly receiving the upper portion of the second locking member.

6. The assembly of claim 5, wherein the operating member further comprises an operation handle extending from the cam for engaging with the retention module at the locked position.

7. The assembly of claim 4, wherein the upper portion of the first locking member is bent downwardly to form a locking portion for engaging with the first flat plate of the heat sink.

8. The assembly of claim 4, wherein the first and second locking members each have a resilient portion formed at a central portion thereof for increasing resiliency.

9. The assembly of claim 8, wherein a plurality of reinforcing ribs is provided at the resilient portion for increasing mechanical performance of the associated locking member.

10. The assembly of claim 4, wherein the retention module has a pair of protruding portions formed at opposite sides thereof and the first and second locking members each have a retaining hole at the bottom portion for engaging with a corresponding protruding portion of the retention module.

11. An assembly comprising:
a retention module adapted for enclosing an integrated circuit module therein;
a heat sink adapted for mounting on the integrated circuit module; and
a locking device for securing the heat sink to the retention module, the locking device comprising:
a first locking member securing the heat sink to the retention module;
a second locking member having a lower portion engaging with the retention module, an upper portion extending through a portion of the heat sink and an arc-shaped resilient portion located between and connecting with the upper and lower portions; and
an operating member having a cam pivotably connected to the upper portion of the second locking member, the operating member being capable of moving from a first position to a second position to cause the cam to downwardly abut against the portion of the heat sink and upwardly pull the second locking member in a direction away from the retention module so that the lower portion of the second locking member firmly engages with the retention module.

12. The assembly of claim 11, wherein the operating member has a free end locking at the retention module when the operating member is at the second position.

13. The assembly of claim 12, wherein the portion of the heat sink through which the upper portion of the second locking member extends is a plate extending outwardly and perpendicularly from an outermost fin of the heat sink.

14. The assembly of claim 12, wherein the retention module comprises two protruding portions engaging with the lower portion of the second locking member and the free end of the operating member, respectively.

15. The assembly of claim 11, wherein the resilient portion has reinforcing ribs formed thereon.

16. The assembly of claim 11, wherein the first locking member has a downwardly bent upper portion engaging with the heat sink.

17. The assembly of claim 11, wherein the first locking member is a one-piece member.

* * * * *